United States Patent [19]

Takigawa et al.

[11] 4,363,995
[45] Dec. 14, 1982

[54] ELECTRON GUN

[75] Inventors: Tadahiro Takigawa, Inagi; Isao Sasaki, Sodegaura; Kazuo Tsuji, Numazu, all of Japan

[73] Assignees: Tokyo Shibaura Denki Kabushiki Kaisha, Kawasaki; Toshiba Machine Company Limited, Tokyo, both of Japan

[21] Appl. No.: 189,908

[22] Filed: Sep. 23, 1980

[30] Foreign Application Priority Data

Sep. 26, 1979 [JP] Japan .................................. 54-123686

[51] Int. Cl.³ ............................................... H01J 1/14
[52] U.S. Cl. .................................... 313/346 R; 313/326
[58] Field of Search ............................. 313/346 R, 326

[56] References Cited

U.S. PATENT DOCUMENTS 3,284,657  11/1966  Weissman ...................... 313/346 R
4,054,946  10/1977  Ferris et al. .................... 313/346 R
4,137,476   1/1979  Ishii et al. ...................... 313/346 R
4,260,525   4/1981  Olsen et al. .................... 313/346 R

OTHER PUBLICATIONS

"Design & Optimization ... Instruments" by Schmidt et al. J. Vac. Sci. Tech. 15(4) Jul./Aug. 1978, pp. 1554-1560.

Primary Examiner—Harold A. Dixon
Attorney, Agent, or Firm—Oblon, Fisher, Spivak, McClelland & Maier

[57] ABSTRACT

An electron gun having a cathode of a lanthanum hexaboride single crystal is disclosed in which the axis of the cathode is set to such a crystal orientation that the electron beam has two intensive emission regions which are asymmetrical with each other in intensity. In the electron gun, even at a low heating temperature of the cathode, a single spot of an image by the electron beam of a more intensive emission region since the electron beam of a weaker intensity emission region is blocked by an aperture.

6 Claims, 12 Drawing Figures

BIAS VOLTAGE : V3

HEATING TEMPERATURE OF CATHODE : T3

ELECTRON GUN

The invention relates to an electron gun having a cathode formed by a single crystal of lanthanum hexaboride ($LaB_6$).

Recently an electron gun having a cathode formed by a single crystal of $LaB_6$ has come to be used in an electron beam apparatus such as an electron beam exposing apparatus. An example of the electron beam exposing apparatus is shown in FIG. 1. FIG. 1 is a schematic arrangement of the structure of the crossover contraction type electron beam exposing apparatus. The electron gun 1 is composed of a cathode 11 made of $LaB_6$ single crystal, a heater 12, a Wehnelt electrode 13 and an anode 14. The electron beam emitted from the electron gun forms a crossover point A. The electron beam from the crossover point A is passed through apertures 2, 9 and 10 disposed coaxially with an optical axis, so that only part of the electron beam passing near the axis is selected. The crossover point A is contractively projected onto a target 4 through an electron lens system composed of condenser lenses 3 and 5, and an objective lens 6. A deflection control system composed of a blanking deflection plate 7 and scanning deflection plates 8a and 8b, which is disposed between a condenser lens 2 and an objective lens 6, effects the scanning by the electron beam on the target 4.

FIG. 2 shows a basic structure of the electron gun applicable for the apparatus shown in FIG. 1. In the electron gun shown in FIG. 2, the cathode 11 is made of the $LaB_6$ single crystal of the quadrangular prism type of which the head portion is shaped like a quadrangular pyramid. The top end of the head portion of the pyramid is circular-cone shaped. The cathode 11 is heated to a given temperature by a heater 12 and a certain bias voltage is applied between the cathode 11 and the Wehnelt electrode 13. Under this condition, when a high voltage is applied between the cathode 11 and the anode 14, an electron beam B is drawn from the end of the cathode 11. The axis of the cathode 11 is selected a crystal orientation $<100>$, for example.

The electron gun using the cathode of the $LaB_6$ single crystal has a high brightness and a long life, compared to an electron gun by a cathode of a sintered body. However, the electron gun has the following disadvantages. The diameter of the crossover image is unstable because the crossover image of the electron beam is separated into a plurality of spots as the heating temperature and the bias voltage decrease. The brightness of the electron beam decreases with the operating time. Further, the operation of the electron gun is easy to be unstable because the high heating temperature evaporates $LaB_6$ which in turn precipitates on the inner surface of the Wehnelt electrode.

Accordingly, an object of the invention is to provide an electron gun in which the crossover image of the electron beam is a single spot even at the low heating temperature of the cathode and the diameter of the electron beam is fixed, and which is operable with a little reduction of the brightness of the electron beam for a long time.

To achieve the above object, there is provided an electron gun having a cathode of the lanthanum hexaboride single crystal, in which the axis of the cathode is set to such a crystal orientation that the electron beam has two intensive emission regions which are asymmetrical to each other in intensity.

With such an arrangement, only one emission of electron beam passes through the apertures 2, 9 and 10, and forms the crossover image, while the other emission of electron beam is blocked by the aperture 2. In this way, the crossover image of a single-spot is obtained. The axis of the cathode is selected within a specific range of the crystal orientation which will subsequently be described in detail.

Other objects and features of the invention will be apparent from the following description in connection with the accompanying drawings, in which.

Figure 3A:
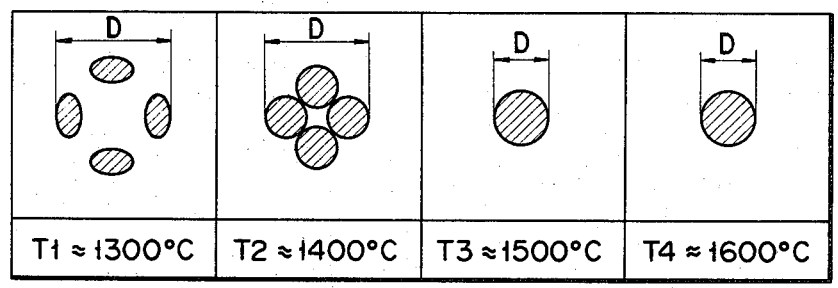
Figure 3B:
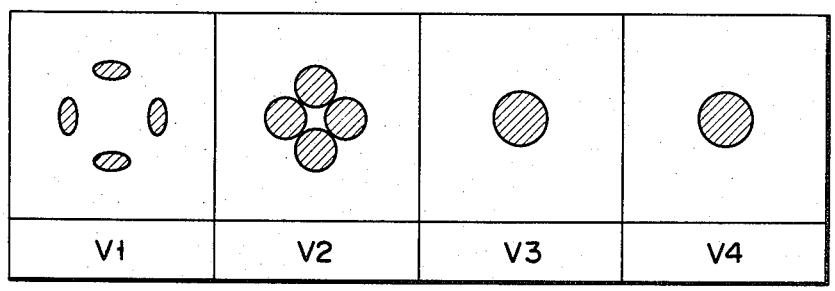
Figure 4:
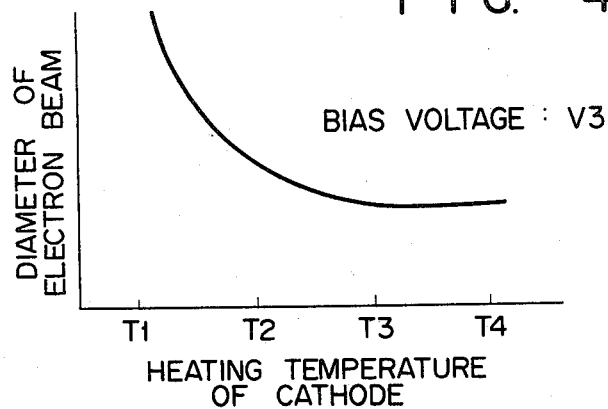
Figure 5A:
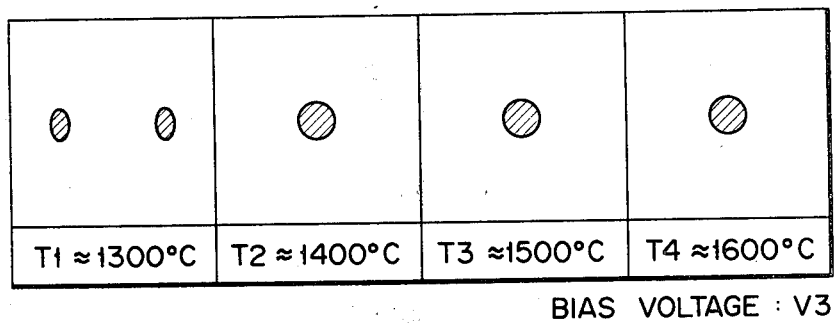
Figure 5B:
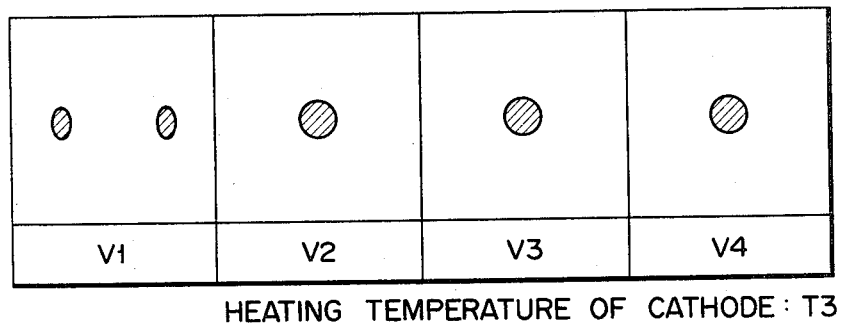
Figure 6:
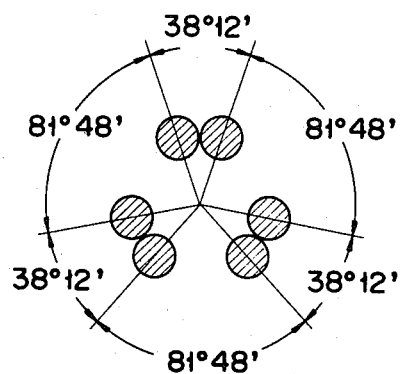
Figure 7:
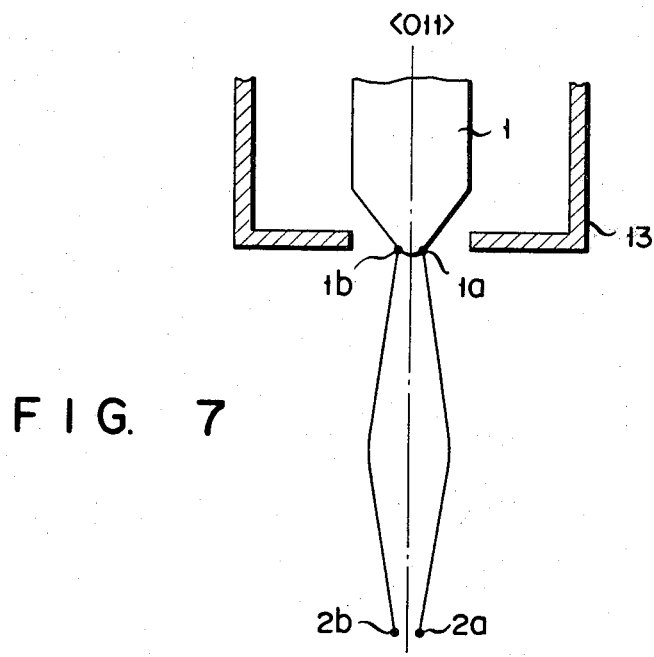
Figure 8:
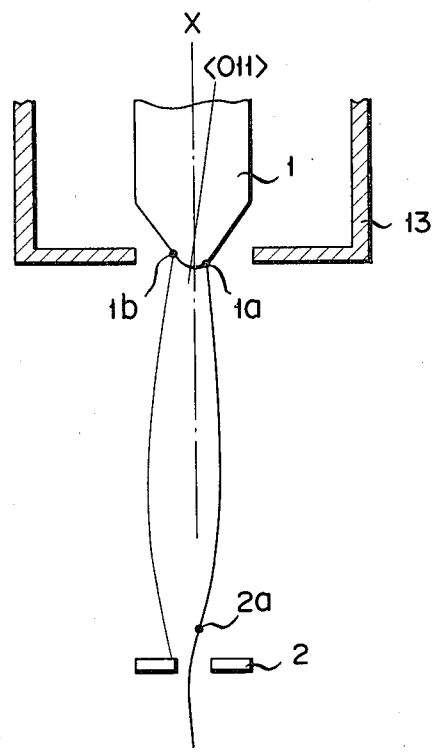
Figure 9:
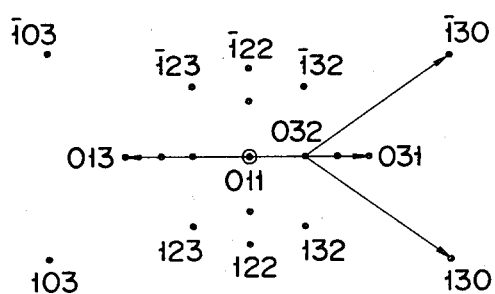
Figure 10:
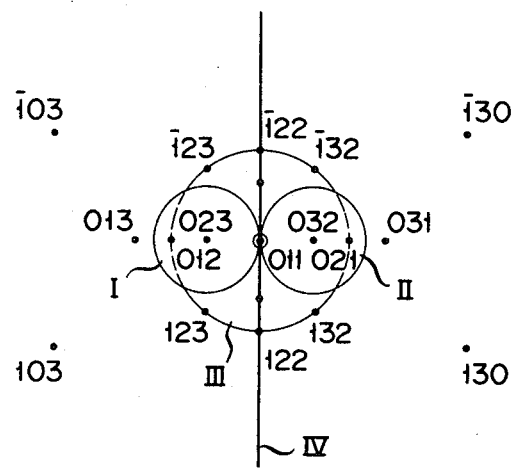

FIG. 3A relatively shows profiles of the crossover image when the axis of the cathode is aligned with a crystal orientation $<100>$ and the number of spots with respect to the heating temperature of the cathode;

FIG. 3B relatively shows profiles of the crossover image when the axis of the cathode is aligned with the crystal orientation $<100>$ and the number of spots with respect to the bias voltage;

FIG. 4 shows a graphical representation of the relation between the diameter of the electron beam and the heating temperature of the cathode when the axis of the cathode is aligned with the crystal orientation $<100>$;

FIGS. 5A and 5B relatively show profiles of the crossover image and the number of spots, when the axis of the cathode is slightly shifted from a crystal orientation $<011>$, with respect to the bias voltage and the heating temperature of the cathode;

FIG. 6 shows the crossover image of the electron beam when the axis of the cathode is aligned with a crystal orientation $<111>$;

FIG. 7 shows the crossover image of the electron when the axis of the cathode is aligned with a crystal orientation $<011>$, in which the crossover image is separated into two spots;

FIG. 8 shows the crossover image as a single spot of the electron beam when the axis of the cathode is slightly shifted from the $<011>$;

FIG. 9 is a stereographic projection diagram of the $LaB_6$ single crystal with the $<011>$ in the center for explaining a region of the crystal orientation as the axis of the cathode of the electron gun of the invention; and FIG. 10 is another stereographic projection diagram of the $LaB_6$ single crystal with the $<011>$ in the center for explaining a region of the crystal orientation as the axis of the cathode of the electron gun of the invention.

Various characteristics of an electron beam emitted from the cathode of an electron gun of the type in which the cathode is made of a single crystal of $LaB_6$ will first be given when the axis of the cathode is set to various crystal orientations. On the basis of the electron beam characteristics, the principle of the invention that the axis of the cathode is set to such a crystal orientation that the intensities of two intensitive electron beam emission regions are disposed asymmetrically, will then be described in detail. Various characteristics of the electron beams emitted from the cathode made of $LaB_6$ single crystal of which the axis is the crystal orientation $<100>$, will first be described. Profiles of a crossover image of the electron beam emitted from such a cathode are illustrated in FIGS. 3A and 3B. As shown, the profile of the crossover image changes depending on heating temperature and bias voltage. To be more specific, as shown in FIG. 3A, when the bias voltage is fixed (V3=800 V), the crossover image is composed of individual four spots at 1,300° C. (T1) and 1,400° C. (T2) of the heating temperature and it is a single spot at 1,500° C. (T3) and 1,600° C. (T4). As shown in FIG. 3B, when the heating temperature is fixed (T3=1,500° C.), the crossover image is composed of four separate spots at 700 V (V1) and 750 V (V2) of the bias voltage, and is a single spot at 800 V (V3) and 850 V (V4). The bias voltage depends largely on a geometrical condition of the electron gun. Those voltages V1 to V4 are merely typical examples. Major requirements for the electron gun used for the electron beam exposing apparatus are: the profile of the crossover image is a single spot; a brightness of the electron beam is little influenced by aging; the heating temperature of the cathode is as low as possible. The use condition of the electrode gun for satisfying the requirements as just mentioned is approximately 1,500° C. for the heat temperature of the cathode and approximately 800 V for the bias voltage, as seen from FIGS. 3A and 3B. A relation between the diameter of the electron gun and the heating temperature when the bias voltage is fixed at 800 V, is graphically represented as shown in FIG. 4. The diameter of the electron beam is defined as D in FIG. 3A. As seen from FIG. 3, the diameter of the electron beam is remarkably increased at the heating temperature lower than 1,500° C., because the crossover image is divided into a plurality of spots. The relation of FIG. 4 is correspondingly applicable for a relation between the diameter of the electron beam and the bias voltage. Accordingly, when the bias voltage falls below 800 V, the electron beam diameter remarkably increases. Thus, the diameter of the electron beam is susceptible for the heating temperature and the bias voltage in the vicinity of 1,500° C. and 800 V. Therefore, those values must be avoided in using the electron gun.

When the crystal orientation <100> is selected for the axis of the LaB$_6$ single crystal cathode, the electron gun is influenced by aging. Accordingly, even under the condition that the heating temperature of the cathode is 1,500° C. and the bias voltage is 800 V, the crossover image is divided into a plurality of spots as the operating time passes and the brightness reduces. For this reason, after a fixed time, it is necessary to adjust the heating temperature and the bias voltage to high values again. Under a condition that an accelerating voltage is 20 KV, the brightness is $1 \times 10^6$ A/str cm$^2$ and the heating temperature is nearly equal to 1,500° C., the electron gun was operated. In this experiment, it was necessary to readjust the heating temperature and the bias voltage every about one hundred hours.

The just-mentioned fact was true for cases that the crystal orientation <111> is selected for the axis of the LaB$_6$ single crystal cathode and that the sintered body was used for the cathode.

The inventors investigated the crossover image of the electron beam radiated from the cathode when the crystal orientation <011> was selected for the axis of the LaB$_6$ single crystal cathode. In the investigation, the crossover image profile had two spots at 1,400° C. of the heating temperature and 750 V of the bias voltage.

From this fact, the inventors estimated that if, of the two intensive emissions of the electron beam for forming two spots of the crossover image obtained when the axis of the single crystal cathode is selected the crystal orientation <011>, one is selected more intensive than the other, that is to say, if those two intensive emissions of the electron beam are asymmetrically radiated, the crossover image of a single spot might readily be formed. On the estimation, the inventors investigated the dependency of the profile of the crossover image of the electron beam radiated from the cathode when the axis of the LaB$_6$ single crystal cathode is set with a slight inclination, e.g. 3°, with respect to the crystal orientation <011>, upon the heating temperature and the bias voltage. The result of the investigation is as illustrated as shown in FIGS. 5A and 5B. As seen from those figures, the profile and the diameter of the crossover image of the electron beam are stable when the heating temperature of the cathode is approximately 1,400° C. or more and the bias voltage is approximately 750 V or more. Under a use condition of the electron gun that the heating temperature is approximately 1,500° C. and the bias voltage is about 800 V, a desired brightness of the image screened was stably obtained and an interval for the readjustment of the use condition was elongated up to 1,500 hours.

The electron gun with the LaB$_6$ single crystal cathode of which the axis is slightly shifted from the crystal orientation <011> exhibited good results: the profile and the diameter of the crossover image were constant over a wide operating condition; the crossover image was not divided into a plurality of spots; the brightness of the image were stable over a long time.

To know the reason why the above-mentioned results was obtained, the inventors analyzed the number of spots of the crossover image and an angle of one spot to another by using the LaB$_6$ single crystal cathode with the axis of the crystal orientation <111>. The result of the experiment for the analyzing conducted under a condition that the heating temperature is about 1,400° C. and the bias voltage is about 750 V, is shown in FIG. 6. The figure illustrates six spots and their angular relations. It is estimated from the results shown in FIG. 6 that the electron beam would be radiated from a region substantially as a {310} face of the end portion of the cathode and the six crossover images would correspond to the emissions radiated from the crystal surfaces on the end portion of the cathode.

From such a fact, it is seen that in the case of the LaB$_6$ single crystal cathode with the axis of the <011>, two spots of the crossover image correspond to the electron beam emissions radiated from (013) and (031) in the {310} face. This is schematically illustrated in FIG. 7. As shown, (031) and (013) are located at two points 1$a$ and 1$b$ on the end portion of the LaB$_6$ single crystal cathode 1 oriented <011>. Below 1,400° C., the electron beam emissions are radiated with the same intensity, so that two spots 2$a$ and 2$b$ are formed on the crossover point. When the cathode axis is slightly shifted from the <011>, as shown in FIG. 8, the intensity of the electron beam emission radiated from the point 1$b$ far from the axis X of the cathode, i.e. the (013) surface, is weaker, so that a spot 2$a$ by the emission from the (031) surface appears intensively. Thus, by using the LaB$_6$ single crystal cathode slightly shifted from the <011>, an electron beam with emission regions of which the intensities are asymmetrical is produced. Only the intensive emission passes through the aperture 2 disposed after the crossover point while the weaker emission is blocked by the aperture 2. In this way, a single beam spot may readily be formed. If the intensities of the two emission regions are equal to each other, parts of the two emission regions concurrently pass through the aperture 2. Therefore, it is difficult to form a single spot. When the axis alignment is performed under computer control, two solutions are provided for the axis aligning condition, resulting in no convergence.

Figure 1:
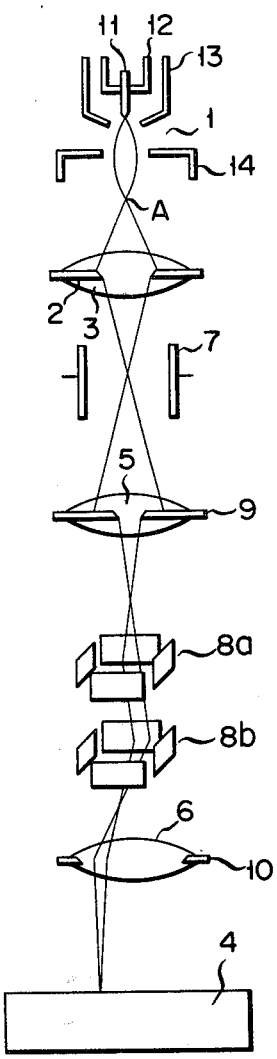
FIG. 1 shows a schematic diagram of the structure of the crossover contraction type electron beam exposing apparatus.
Figure 2:
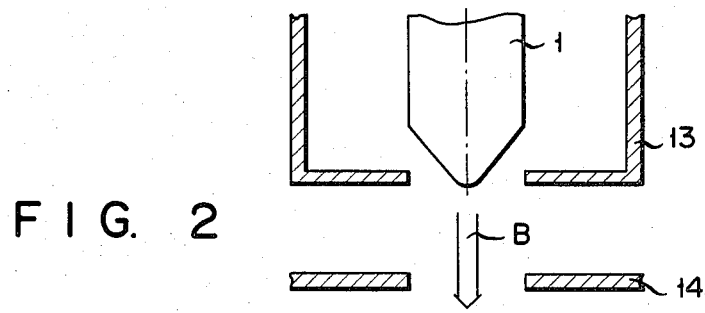
FIG. 2 shows a basic structure of the electron gun.

When the number of the beams is increased to four or six ones by the cathode using other crystal orientations for the axis, it is difficult to select only one emission region by the aperture. Therefore, it is also difficult to form the single spot, as referred to with relation to the crystal orientation <100>. Thus, a less number of the intensive emissions radiated from the cathode, ideally one emission, is preferable. The single crystalline LaB$_6$ as shown in FIG. 2 can not form a single intensive emission. Even if it is well utilized, only two intensive emissions with different intensities could be formed, as described above.

The above-mentioned phenomena were analyzed by using a stereographic projection of the LaB$_6$ single crystal. FIG. 9 shows a stereographic projection diagram as viewed from the <011> of the LaB$_6$ single crystal. As seen from the figure, when <032>, for example, is selected for the crystal orientation slightly shifted from the <011>, <031> is present near the <032> and <013>, <130> and <$\bar{1}$30> are present far from the <032>. From this, it is considered that the axis of the cathode of the <032> is the most preferable crystal orientation to obtain the crossover image of the single spot. In our experiment, the preferable crystal orientation was 30° or more shifted from <011> for the axis of the cathode and particularly <032> shifted by 11°18′ from the <011> is most preferable.

From the analysis of the LaB$_6$ single crystal cathode using the crystal orientations <011> and <032> as the axes, it is concluded that the axis of the cathode to provide the crossover image of the single spot, must be the crystal orientation in the region obtained by removing a region defined by <011>, preferably by an inclination of less than 3° from the orientation <011> from a region defined by an inclination of 11°18′ to the <032>. The same thing is true for the crystal orientation <023> equivalent to the <032>. The single spot of the crossover image is also formed when the axis of the LaB$_6$ single crystal cathode is selected a crystal orientation in a region obtained by removing a region on a straight line passing <$\bar{1}$22>, <011> and <122>, preferably a region extended by an inclination of less than 3° from a region within a circle defined by orientations <123>, <122>, <132>, <$\bar{1}$32> and <$\bar{1}$22>, in a stereographic projection diagram centered at <011> shown in FIG. 10.

In summary, the crystal orientation region usable for the axis of the cathode of the LaB$_6$ single crystal is a fourth region IV of a region on the straight line connecting the crystal orientations <$\bar{1}$22>, <011> and <122>, preferably a region extended by an inclination of less than 3° to the straight line the sum of sets of a first region I as a region of the crystal orientation defined by an inclination of 11°18′ to <032>, a second region II as a region of the crystal orientation defined by an inclination of 11°18′ to <023>, and a third region III as a region of the crystal orientation within a circle defined by orientations <123>, <122>, <132>, <$\bar{1}$32>, <$\bar{1}$22> and <$\bar{1}$23>, excluding a fourth region IV of a region on the straight line connecting the crystal orientations <122>, <011> and <122>, preferably a region extended by an inclination of less than 3° to the straight line including the former region in the stereographic diagram of the LaB$_6$ centered at <011> of FIG. 10. Further, the crystal orientation crystallographically equivalent to that within such region may also be used as the axis of the LaB$_6$ single crystal cathode.

The description of the invention has been made by using a case where the axis of the cathode is coincident with the direction of an electric field to pull out the electron beam. The essential thing in the present invention is the intensities of two emissions radiated from the cathode are asymmetrical with each other. The axis of the LaB$_6$ single crystal cathode is selected a crystal orientation, e.g. <011>, in the fourth region IV and the axis of the electron gun, i.e. the direction of the electric field for pulling out the electron beam, may be set to a direction slightly shifted from the <011>, for example, by 1° to 5°.

As described above, in the electron gun of the present invention, the axis of the LaB$_6$ single crystal cathode is specifically related to the electric field for pulling out the electron beam, whereby the intensities of the emissions radiated from the cathode are asymmetrical with each other. As a result, the crossover image of the electron beam may be formed into a single spot even at a low heating temperature of the cathode. In this case, the diameter of the electron beam is fixed and the reduction of the brightness is little even for a long time operation of the electron gun. Accordingly, there is no fear that the gradual rise of the heating temperature for compensating for the reduction of the brightness causes the LaB$_6$ to evaporate and to make instable the operation of the electron gun. Further, the diameter of the electron beam radiated from the cathode depends little on the heating temperature of the cathode and the bias voltage. In this respect, the electron gun of the invention is easy to adjust.

What we claim is:

1. An electron gun having a cathode of a lanthanum hexaboride (LaB$_6$) single crystal, in which the axis of the cathode is set to such a crystal orientation that the electron beam has two intensive emission regions which are asymmetrical with each other in intensity.

2. An electron gun according to claim 1, wherein the axis of said cathode is selected from crystal orientations in a region which, in a stereographic projection diagram centered at <011>, consists of the sum of sets of a first region I defined by a crystal orientation inclined by 11°18′ from <032>, a second region II defined by a crystal orientation inclined by 11°18′ from <023>, and a third region III defined by crystal orientations within a circle formed by connecting <123>, <122>, <132>, <$\bar{1}$32>, <$\bar{1}$22> and <$\bar{1}$23>, excluding a fourth region IV defined by a crystal orientation on a straight line connecting <$\bar{1}$22>, <011> and <122>, or from crystal orientations crystallographically equivalent to the above.

3. An electron gun according to claim 2, wherein said fourth region IV is defined by a crystal orientation inclined by less than 3° from the crystal orientation on the straight line connecting <$\bar{1}$22>, <011> and <122>.

4. An electron gun according to claim 2 or 3, wherein the direction of an electric field to pull out the electron beam from said cathode is aligned with the axis of said cathode.

5. An electron gun according to claim 1, wherein the axis of said cathode is set to a crystal orientation within a region defined by the crystal orientation on the straight line connecting <$\bar{1}$22>, <011> and <122> and the direction of an electric field for pulling out the electron beam from said cathode is inclined with respect to the axis of said cathode.

6. An electron gun according to claim 5, wherein the direction of said electric field is inclined by 1° to 5° with respect to said cathode axis.

* * * * *